(12) United States Patent
Thomassen

(10) Patent No.: US 7,761,977 B2
(45) Date of Patent: Jul. 27, 2010

(54) COMPONENT PLACEMENT DEVICE

(75) Inventor: Jacobus A. M. Thomassen, La Veldhoven (NL)

(73) Assignee: Assembleon N.V., La Veldhoven (NL)

( * ) Notice: Subject to any disclaimer, the term of this patent is extended or adjusted under 35 U.S.C. 154(b) by 0 days.

(21) Appl. No.: 10/563,091

(22) PCT Filed: Jul. 1, 2004

(86) PCT No.: PCT/IB2004/051086
§ 371 (c)(1),
(2), (4) Date: Dec. 30, 2005

(87) PCT Pub. No.: WO2005/004575
PCT Pub. Date: Jan. 13, 2005

(65) Prior Publication Data
US 2006/0156539 A1     Jul. 20, 2006

(30) Foreign Application Priority Data
Jul. 3, 2003     (EP) .................................. 03101995

(51) Int. Cl.
B23P 19/00     (2006.01)
B65G 47/10     (2006.01)
(52) U.S. Cl. .............................. 29/739; 29/740; 29/741; 29/742; 29/743; 29/766; 198/369.1
(58) Field of Classification Search .................. 29/740, 29/739, 741, 742, 786, 743, 766; 198/369.1, 198/419.2, 407; 414/737, 752; 901/7, 39; 269/295, 304
See application file for complete search history.

(56) References Cited

U.S. PATENT DOCUMENTS

| 4,027,246 | A | * | 5/1977 | Caccoma et al. ............. 700/121 |
| 4,955,775 | A | * | 9/1990 | Ohkase et al. ............... 414/152 |
| 5,033,185 | A | * | 7/1991 | Hidese ......................... 29/740 |
| 5,155,903 | A | * | 10/1992 | Nakashima et al. ........... 29/832 |
| 5,323,528 | A | * | 6/1994 | Baker .......................... 29/721 |
| 5,491,888 | A | * | 2/1996 | Sakurai et al. ................ 29/832 |
| 5,671,530 | A | * | 9/1997 | Combs et al. ................. 29/834 |
| 5,724,722 | A | * | 3/1998 | Hashimoto .................... 29/740 |
| 5,745,241 | A | * | 4/1998 | Hashimoto ................... 356/635 |
| 5,778,524 | A | * | 7/1998 | Stridsberg .................... 29/836 |
| 5,778,525 | A | * | 7/1998 | Hata et al. .................... 29/836 |
| 5,839,186 | A | * | 11/1998 | Onodera ....................... 29/720 |
| 5,855,059 | A | * | 1/1999 | Togami et al. ................ 29/740 |

(Continued)

FOREIGN PATENT DOCUMENTS

CN     1345178 A     4/2002

(Continued)

*Primary Examiner*—Derris H Banks
*Assistant Examiner*—Tai Nguyen
(74) *Attorney, Agent, or Firm*—Foley & Lardner LLP

(57) ABSTRACT

A component placement device includes: (a) an elongated transport device by means of which substrates to be provided with components can be moved in a transport direction parallel to the transport device; (b) at least one component feeder that is located along a longitudinal side of the transport device; (c) at least one component pick-and-place unit by means of which in operation a component can be picked-up from the component feeder and placed on a substrate; and (d) a substrate support, which is located along a longitudinal side of the transport opposite to the component feeder.

13 Claims, 5 Drawing Sheets

U.S. PATENT DOCUMENTS

| | | | |
|---|---|---|---|
| 5,860,208 A * | 1/1999 | Nomura | 29/740 |
| 5,894,657 A * | 4/1999 | Kanayama et al. | 29/740 |
| 6,000,123 A * | 12/1999 | Munezane et al. | 29/740 |
| 6,036,425 A * | 3/2000 | Seto | 414/277 |
| 6,154,954 A * | 12/2000 | Seto et al. | 29/740 |
| 6,230,393 B1 * | 5/2001 | Hirano et al. | 29/740 |
| 6,260,260 B1 * | 7/2001 | Suhara | 29/740 |
| 6,571,462 B1 * | 6/2003 | Mimura et al. | 29/743 |
| 2004/0143963 A1 | 7/2004 | Mehdianpour et al. | |

FOREIGN PATENT DOCUMENTS

| | | |
|---|---|---|
| CN | 1817074 | 8/2006 |
| CN | 1897807 | 1/2007 |
| DE | 101 25 392 A1 | 12/2002 |
| JP | 2002-217592 A | 8/2002 |

\* cited by examiner

COMPONENT PLACEMENT DEVICE

BACKGROUND

The invention relates to a component placement device comprising an elongated transport device by means of which substrates to be provided with components can be moved in a transport direction parallel to the transport device. The component, placement device further comprises at least one component feeder, which is located along a longitudinal side of the transport device, as well as a component pick-and-place unit by means of which a component can be picked-up from the component feeder and placed on a substrate. One such component placement device is disclosed in International Patent Application No. WO95/19099, in which component feeders are arranged on either one of the two longitudinal sides of the transport device.

By means of pick-and-place units, components are picked-up from the component feeders and placed on the substrates supported by the transport device. The size of the substrate in a direction transverse to the transport direction depends, among other things, on the distance between the feeders located on either one of the two sides of the transport device. To keep the distance between the component feeders and the substrate as short as possible, the component feeders are typically arranged as close to the transport device as possible. The size of the substrates that can be provided with components by conventional devices is such that on the one hand a great variety of substrates can be provided with components by the same component placement device, whereas at the same time the distance between the component feeders and the substrates is as short as possible.

FIG. 1 shows a conventional component placement device 1. The device 1 includes, among other things, a frame 2, a transport device 3 supported by the frame 2, a beam 4 supported by the frame 2, and rows of component feeders 5 supported by the frame 2. The rows of component feeders 5 are positioned along either one of the two sides of the transport device 3. The beam 4, which is movable in and opposite to the direction indicated by the arrow Y, supports a slide 6 that includes a number of component pick-and-place units 7. The pick-and-place units 7 are movable, by means of the slide 6, relative to the beam 4 in and opposite to the direction indicated by the arrow X. The transport device 3 comprises two guide profiles 8 that extend parallel to each other.

The operation of the conventional component placement device 1 is as follows. A substrate 9 is supported by the guide profiles 8 and is transported by the transport device 3 in the direction indicated by the arrow X through the component placement device 1. The component pick-and-place units 7 are moved in and opposite to the direction indicated by arrow X and also in and opposite to the direction indicated by the arrow Y between the various component feeders at which components are picked-up from the component feeders 5 by means of the component pick-and-place units 7. Subsequently, the component pick-and-place units 7 are consecutively taken to the desired positions on the substrate 9 at which the components are mounted on the substrate 9 by means of the component pick-and-place units 7. The maximum size B of the substrate 9 is determined by the maximum mutual distance between the guide profiles 8 of the transport device 3. Consequently, substrates 9 having a size B which is, for example, twice or three times as large as the size shown in FIG. 1, cannot be provided with components by the transport device 3.

In practice, this means that relatively large substrates (i.e., substrates that have a relative large dimension in a direction that extends transverse to the transport direction) cannot be provided with components by means of the conventional component placement devices. Such large substrates must be provided with components either by hand or by a special, alternative (or additional) component placement device, which has a relatively large distance between the component feeders and the substrate. In addition, such alternative (or additional) a component placement devices are relatively expensive, occupy a relatively large amount of space, and are used relatively rarely.

Therefore, it is an object of the invention to provide a component placement device that is suitable in a relatively simple manner for components to be placed on both relatively large substrates and on customary substrates.

SUMMARY

The aforementioned object is achieved with the component placement device according to the invention, which further comprises a substrate support. The substrate support is situated along a longitudinal side of the transport device, which side faces away from the component feeder. By means of the substrate support, relatively large substrates can be supported on a side facing away from the component feeder. By means of the component pick-and-place unit or units, components are picked-up from the component feeder and moved over the transport device to the substrate supported by the substrate support. The substrates having relatively small, normal, or customary sizes are moved through the component placement device in customary fashion by means of the transport device and provided with components by means of the pick-and-place unit. The time required for placing the components on the customary substrates will not be affected or hardly be affected by the addition of the substrate support, while the substrate support is instrumental in providing the ability to mount components on relatively large substrates in an efficient manner by means of an already available component placement device.

An embodiment of the component placement device according to the invention is characterized in that the substrate supports are detachably connected to the component placement device. If the substrate support is detachably connected to the component placement device, it is possible to remove the substrate support the moment when only customary substrates are to be provided with components. It is then possible for movable component feeders to be added to the component placement device once the substrate support has been removed. As a result, the number of different components that can be positioned on the substrate transported by means of the transport device is increased and the speed at which the components can be mounted on the substrates is also increased.

Another embodiment of the component placement device according to the invention is characterized in that the substrate support comprises driving means by which a substrate can be moved in a feeding direction that extends transverse to the transport direction. A substrate supported by the substrate support can easily be moved in the transport direction by the driving means so that the substrate is located as close as possible to the component placement device(s) located on the other side of the transport device at the time when components from the component placement devices are mounted on the substrate by means of the component pick-and-place unit.

Yet another embodiment of the component placement device according to the invention is characterized in that the transport device comprises at least one guide profile that extends parallel to the transport direction. The guide profile, which is connected to the substrate support, together with the substrate support is movable in a direction that extends transverse to the transport direction. In this manner, it is possible to move the guide profile of the transport device in the direction of the component placement device, so that the width occupied by the transport device is limited. Moreover, at the same time, the substrate support connected to the guide profile is also moved in the direction of the component feeder. As a result, the distance between the component feeder and the substrate support is diminished.

Yet another embodiment of the component placement device according to the invention is characterized in that the substrate support comprises two parallel guides that extend transverse to the transport direction. By means of such guides it is possible, in a simple manner, to move a substrate to and from the component feeders and also to efficiently support a substrate. If the distance between the guides is adjustable, the substrate support can be simply adapted to substrates of different sizes.

Yet another embodiment of the component placement device according to the invention is characterized in that the substrate support can be moved vertically from a position situated parallel to the transport device to a position underneath the transport device. As a result of the vertically movable substrate support, it is possible, in a simple manner, to move the substrate support between a position in which the substrate support is situated parallel to the transport device, so that a substrate on which components can be mounted can be supported by the substrate support. The substrate support is further movable to a position underneath the transport device, where the substrate support is unfit for supporting substrates but where the room above the substrate support is accessible, for example, for additional component feeders.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1:
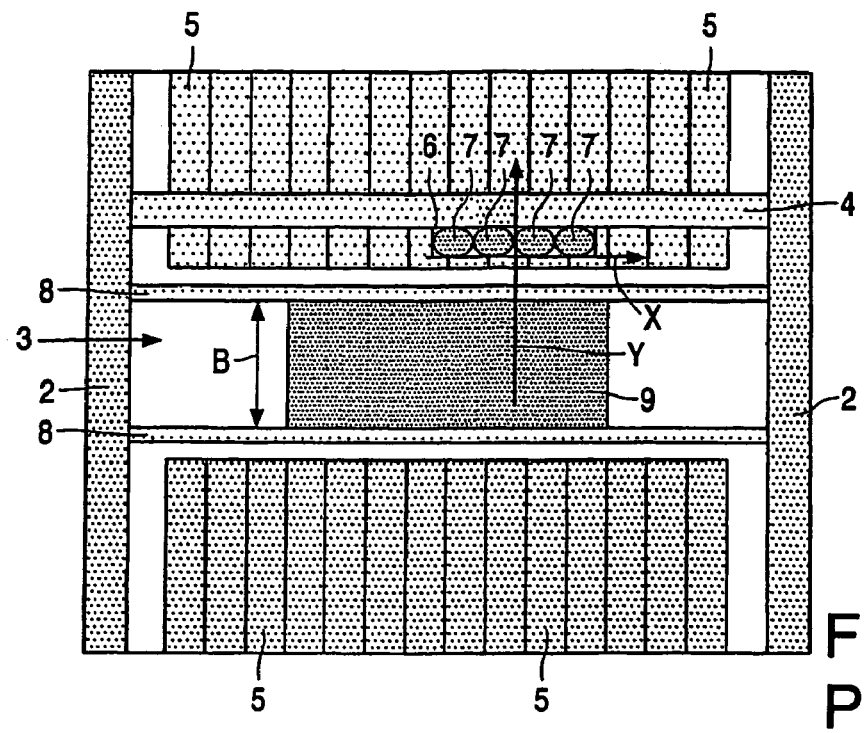
FIG. 1 is a plan view of a conventional component placement device.

Efforts have been made throughout the drawings to use the same or similar reference numerals for the same or like components.

Figure 2:
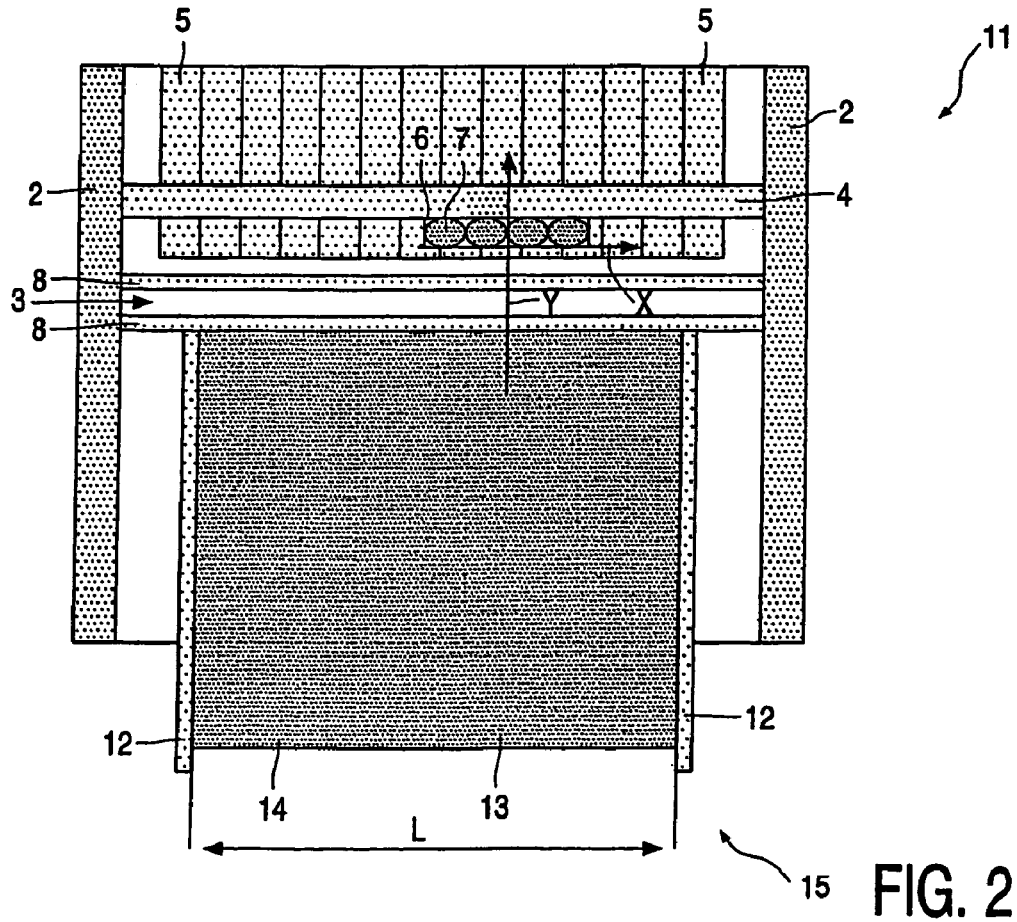
FIG. 2 is a plan view of a first embodiment of a component placement device according to the invention.

FIG. 2 shows a plan view of a first embodiment of a component placement device 11 according to the invention that largely corresponds to the device 1 shown in FIG. 1. The component placement device 11, however, has only one row of component feeders 5 on one side of the transport device 11. On a side of the transport device 3 that faces away from the component feeders 5, the component placement device 11 comprises two guides 12 that extend transverse to the transport device (as indicated by the arrow X) to support a relatively large substrate 13. Components are placed on the substrate 13 in a comparable manner to the component placement device 1 shown in FIG. 1. The area 14 of the substrate 13 that can accommodate components is limited by the maximum displacement of the slide 6 in the direction opposite to the arrow Y relative to the frame 2. If the substrate area 14 that is situated outside the component placement device 11 is also to be provided with components, the substrate 13 is rotated (e.g., by 180°) after it has partially been provided with components.

The guides 12, which form a substrate support 15, can permanently be connected to the guide profiles 8, in which case the component placement device 11 is directly available for placing components on relatively large substrates 13. The distance between the guides 12 is preferably adjustable, so that substrates 13 of different sizes can be simply supported by the guides 12. As is apparent from FIG. 2, the guide profile 8 situated close to the guides 12 has been moved relatively close to the other guide profile 8 of the transport device 3. As a result, the distance between the component feeders 5 and the substrate 13 is relatively small.

If components are to be placed on a relatively small substrate 9 by means of the component placement device 11, the guide profiles 8 are brought to such a mutual distance that the substrate 9 to be provided with components can be supported by the guide profiles 8. Subsequently, the substrate 9 is transported by the component placement device 11 in the transport direction indicated by the arrow X in a similar manner to the one explained with reference to FIG. 1, in which components are picked-up from the component feeders 5 and placed on the substrate 9 by means of the component pick-and-place units 7.

If the guides 12 continue to be connected to the guide profile 8, only component feeders 5, which are located on a side of the transport device 3 that faces away from the guides 12, can be used. However, if the guides 12 are detachably connected to the component placement device, once the guides 12 have been removed, removable or movable component feeders 5 can be placed in the space vacated by the guides 12. As a result, the component placement device 11 can function in a similar manner to the component placement device 1 shown in FIG. 1.

Figure 3:
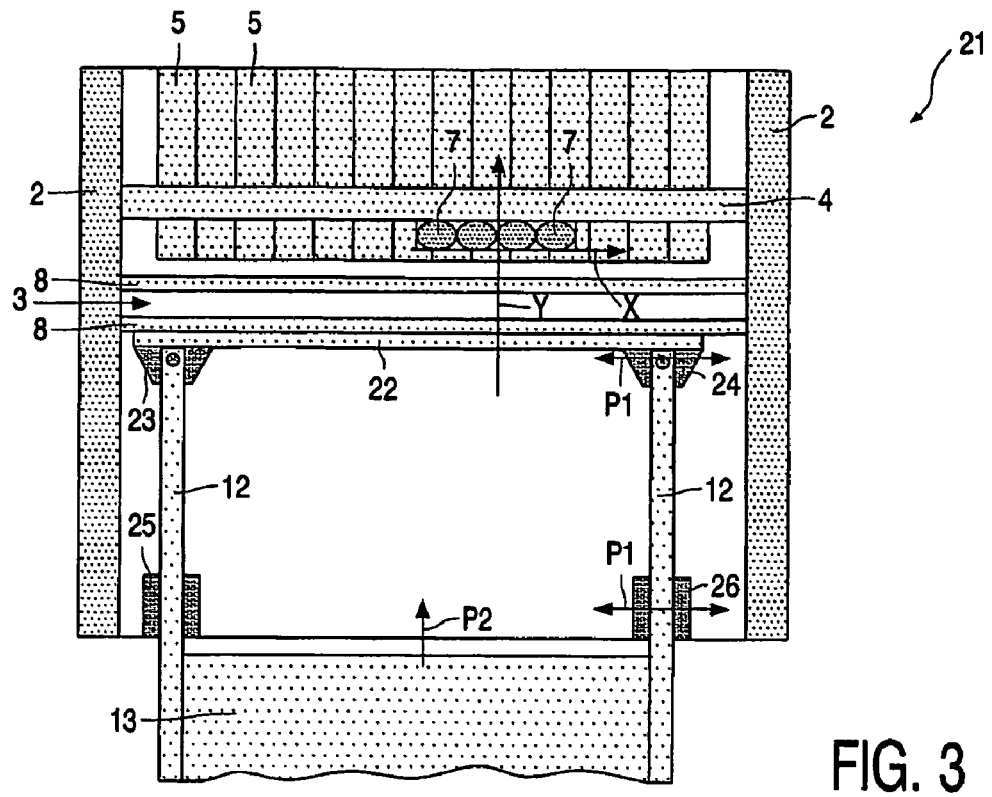
FIG. 3 is a plan view of a second embodiment of a component placement device according to the invention.

FIG. 3 shows another embodiment of a component placement device 21 according to the invention. This embodiment is, distinguished from the component placement device 11 shown in FIG. 2 in that the guide profile 8 that faces away from the component feeders 5 comprises a coupling strip 22. The coupling strip 22 has supports 23, 24 at both ends thereof, respectively. One support 24 can be moved along the coupling strip 22 in the directions indicated by the double arrow P1, so that the mutual distance between the supports 23 and 24 can be simply adjusted. The supports 23, 24 are used for supporting the guides 12, which extend transverse to the guide profile 8 and the coupling strip 22 connected to it. On a side facing away from the guide profile 8, further supports 25, 26 are provided to render additional support to the guides 12 and the substrates 13 to be supported by the guides 12. The coupling strip 22, the supports 23-26 and the guides 12 together form a substrate support. A substrate 13 is moved in the direction indicated by the arrow P2, supported by the guides 12 to the component feeders 5 either manually or by means of a substrate feeder until a head end of the substrate 13 abuts the coupling strip 22. Subsequently, components from the component feeders 5 are placed on the substrate 13 in a similar manner to the one explained with reference to the component placement device 11 shown in FIG. 2.

Figure 4:
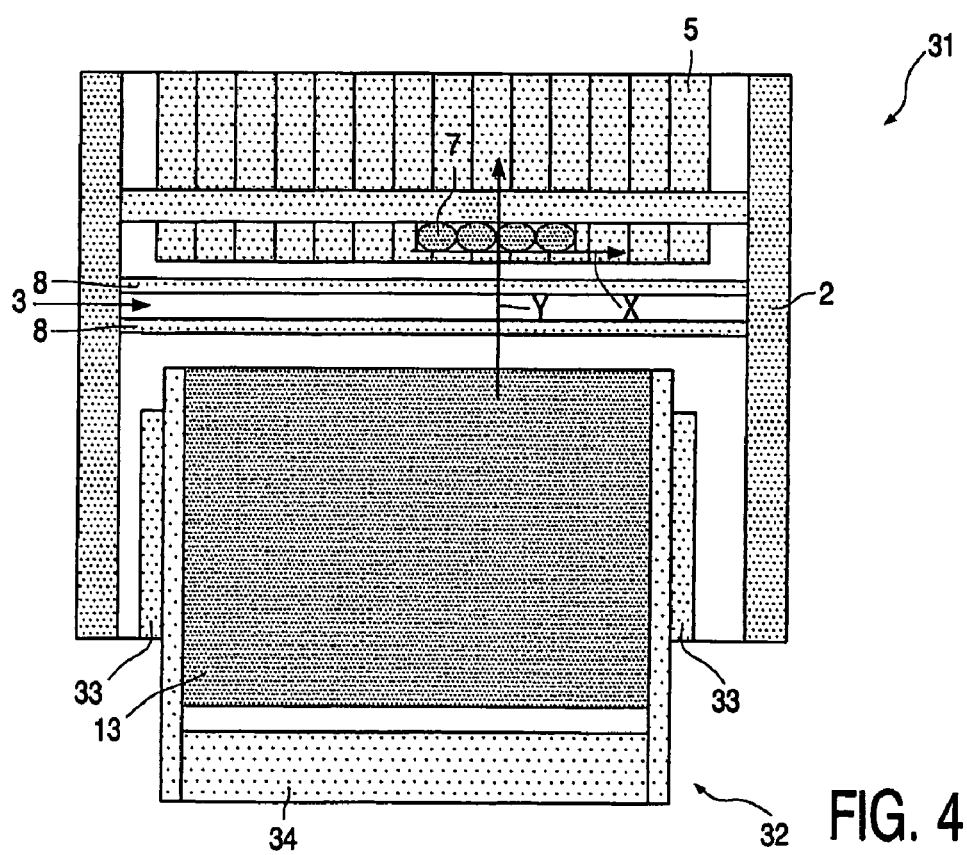
FIG. 4 is a plan view of a third embodiment of a component placement device according to the invention.

FIG. 4 shows a further embodiment of a component placement device 31 according to the invention, which largely corresponds to the component placement device 11 shown in FIG. 2. The component placement device 31 distinguishes itself from the component placement device 11 in that on a side that faces away from the component feeder 5 there is a movable substrate support 32 that has an undercarriage on wheels 33 and a substrate holder 34 supported by the carriage. Components can be placed on the substrate 13 by means of the component pick-and-place units 7 in a similar manner to the one that is explained with reference to FIG. 2. Preferably, stops are provided in the component placement device 31 against which the undercarriage on the wheels 33 can be accurately positioned in directions X, Y and Z. The undercarriage on wheels 33 makes it possible to provide a relatively large substrate 13 with components in a relatively fast manner. Once the substrate 13 has been provided with components, the undercarriage on wheels 33 is removed and the thus available room is preferably occupied by a detachable row of component feeders 5.

Figure 5A:
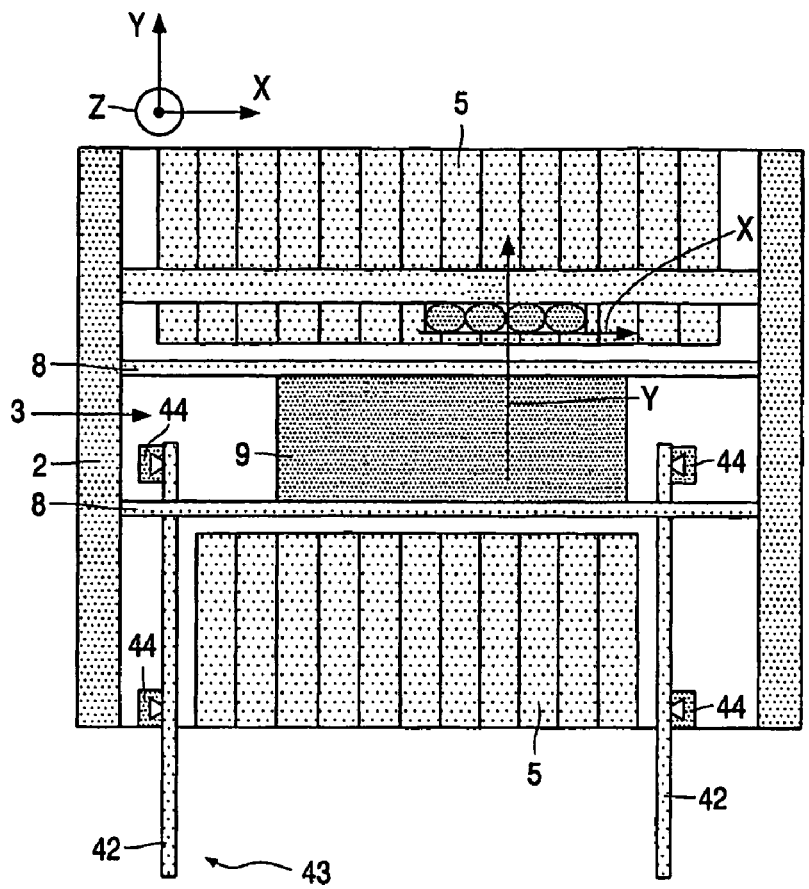
FIGS. 5A and 5B are plan views of a fourth embodiment of a component placement device according to the invention, which device includes component feeders positioned between a substrate support and a substrate supported by the substrate support.
Figure 5B:
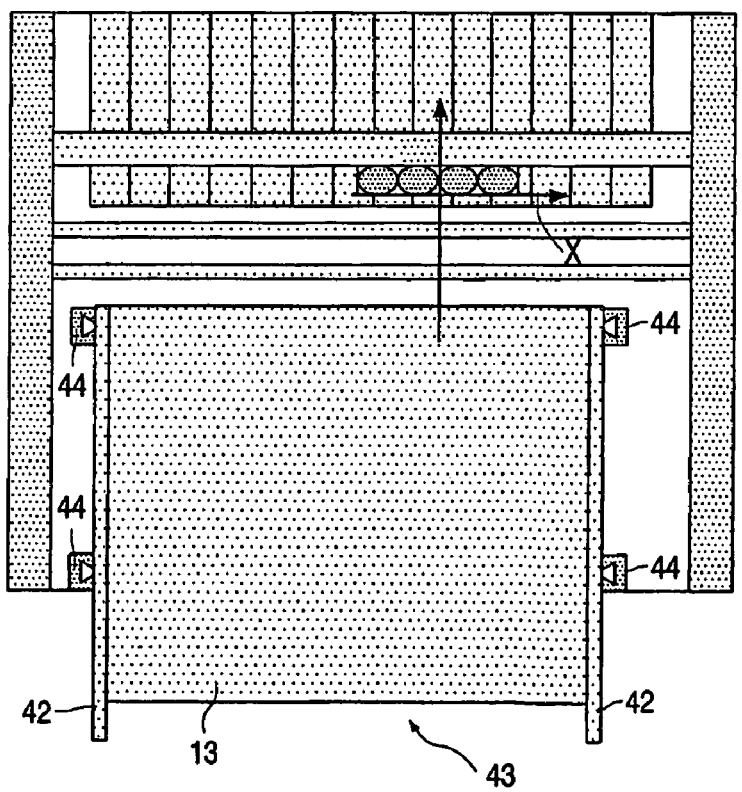

FIGS. 5A and 5B show yet another embodiment of a component placement device 41 according to the invention. This embodiment, comprises two guides 42 that form a substrate support 43 and that extend transverse to the guide profiles 8. The guides 42 each have two supports 44 relative to which the guides 42 can be moved in a direction Z that extends transverse to the plane of the drawing. In the position shown in FIG. 5A the guides 42 are in relatively low position underneath the guide profiles 8 where the guides 42 do not cause any hindrance to the substrate 9 to be transported over the guide profiles 8. Components are picked-up from the component feeders 5 positioned on either one of the two sides of the transport device 3 and placed on the substrate 9 in the manner previously described by means of component pick-and-place units 7. If relatively large substrates 13 are desired to be provided with components by means of the component placement device 41, the row of component feeders 5 positioned between the guides 42 is temporarily removed. Then, the guide profile 8 that is located above the guides 42 is moved in the direction of the other guide profile. Thereafter, the guides 42 are moved in an upward direction Z relative to the supports 44 until the guides 42 are situated in the same plane as the guide profiles 8. Subsequently, a substrate 13 on which components are to be placed in the manner previously described is put on the guides 42. In the device 41, the substrate support 43, therefore, need not be removed completely. As a result, relatively large substrates 13 can also be provided with components in a relatively fast manner.

Figure 6:
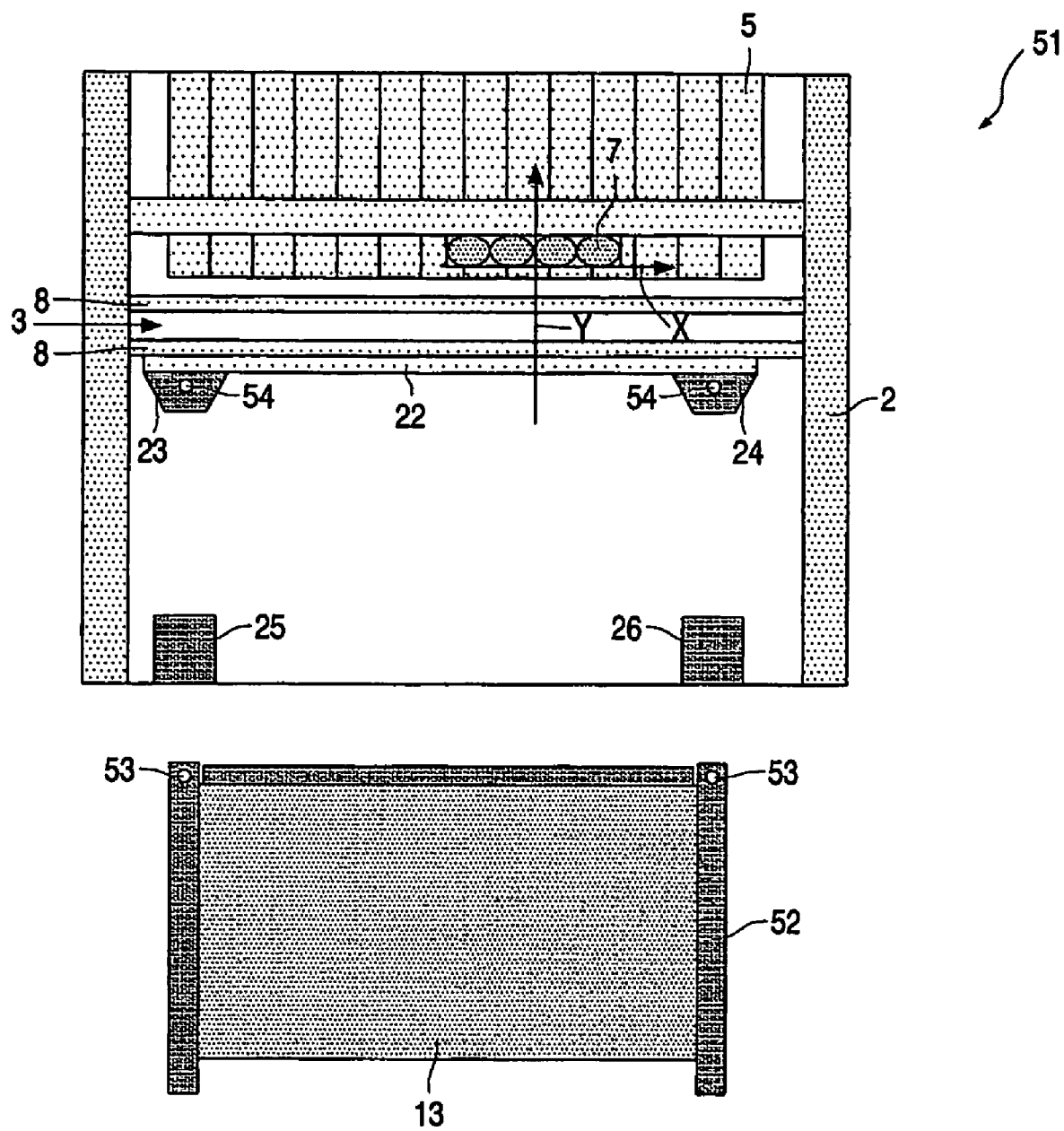
FIG. 6 is a plan view of a further embodiment of a component placement device according to the invention.

FIG. 6 shows yet another embodiment of the component placement device 51 according to the invention. This embodiment, largely corresponds to the component placement device 21 shown in FIG. 3. The component placement device 51 distinguishes itself from the component placement device 21 in that component placement device 51 comprises a substrate holder 52 on which a large substrate 13 is positioned at a location beside the component placement device 51. Subsequently, the substrate holder 52 is placed with positioning holes 53 over pins 54 that protrude from the supports 23, 24. The substrate support 52 is supported by the supports 25, 26 on a side that faces away from the supports 23, 24. After the substrate 13 has been inserted into the component placement device 51 in the manner previously described, components from the component feeders 5 are placed on the substrate 13 by means of the component pick-and-place units 7.

Figure 7A:
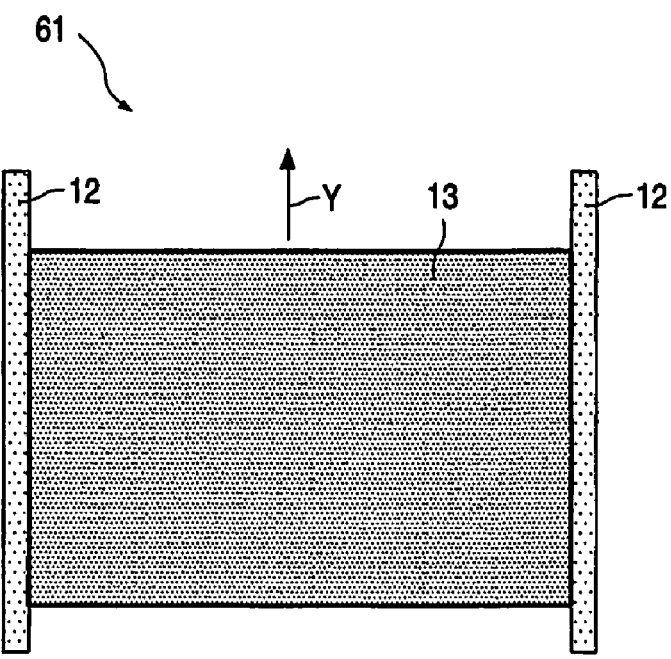
FIGS. 7A-7D are plan views of a substrate support and various driving means for the substrate support, respectively.
Figure 7B:
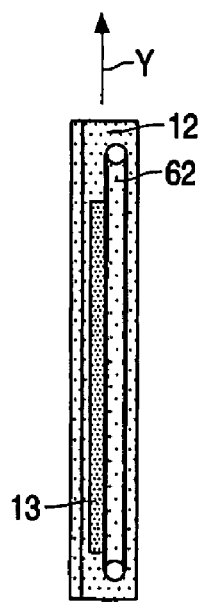
Figure 7C:
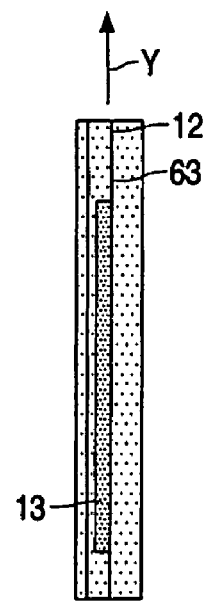

FIGS. 7A-7D are plan views of a number of different side elevations of a substrate support 61. The substrate support 61 comprises at least two parallel guides 12 for supporting a large substrate 13, as shown in FIG. 7A. The size of the relatively large substrate 13 permitting, it is quite possible to place a single or a couple of component feeders 5 beside the substrate 13. FIG. 7B shows a guide 12 that comprises an endless conveyor belt 62 for transporting the substrate 13 in and opposite to the direction indicated by arrow Y. FIG. 7C shows a guide 12 that comprises a relatively smooth support surface 63 over which the substrate 13 can be slid by hand in and opposite to the direction indicated by the arrow Y.

Figure 7D:
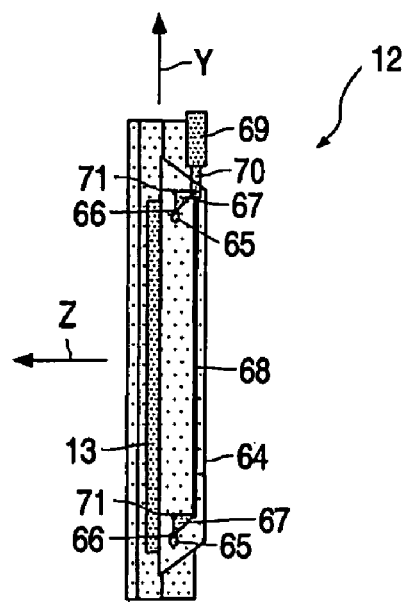

FIG. 7D shows a guide 12 that comprises strip 64 that supports an edge of the substrate 13. The strip 64 has two grooves 65 that extend in the direction Y. Pins 66 are situated in grooves 65, which pins 66 are each connected to respective triangular coupling pieces 67 at one side thereof. Opposites sides of the coupling pieces 67 are hingeably connected to a coupling rod 68 an end of which is connected to a piston 70 that is movable in a cylinder 69. By moving the piston 70 from the position shown in FIG. 7D in a direction opposite to the arrow Y, the coupling pieces 67 will be swiveled around shafts 71 as a result of which the strip 64 is moved in upward direction Z together with the substrate 13.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

The invention claimed is:

1. A component placement device comprising:
   an elongated transport device that is configured to transport a first substrate in a transport direction parallel to the transport device;
   at least one component feeder that is located along a longitudinal side of the transport device;
   at least one component pick-and-place unit that is configured to: (a) pick-up a component from the at least one component feeder; and (b) place the component on the first substrate supported by the elongated transport device; and
   at least one substrate support that is configured to support a second substrate, wherein the at least one substrate support is positioned on only one longitudinal side of the transport device that is opposite from the longitudinal side at which the component feeder is located, and the at least one substrate support has a longitudinal direction that extends perpendicular to the transport direction,
   wherein the at least one component pick-and-place unit is further configured to: (c) pick-up a component from the at least one component feeder; and (d) move the component over the elongated transport device to place the component on the second substrate supported by the substrate support.

2. The component placement device as claimed in claim 1, wherein the substrate support is detachably connected to the component placement device.

3. The component placement device as claimed in claim 1, wherein the substrate support comprises drive means configured to transport the second substrate in a feeding direction that extends transverse to the transport direction.

4. The component placement device as claimed in claim 3, wherein the substrate support comprises two guides that extend parallel to each other and transverse to the transport direction.

5. The component placement device as claimed in claim 4, wherein a distance between the guides is adjustable.

6. The component placement device as claimed in claim 3, wherein the substrate support is configured to be moved vertically from a position parallel to the transport device to a position underneath the transport device.

7. The component placement device as claimed in claim 1, wherein the transport device comprises at least one guide profile that extends parallel to the transport direction,
   wherein the at least one guide profile is connected to the substrate support, and
   wherein the at least one guide profile is configured to be moved together with the substrate support in a direction that extends transverse to the transport direction.

8. The component placement device as claimed in claim 7, wherein the substrate support comprises two guides that extend parallel to each other and transverse to the transport direction.

9. The component placement device as claimed in claim 8, wherein a distance between the guides is adjustable.

10. The component placement device as claimed in claim 7, wherein the substrate support is configured to be moved vertically from a position parallel to the transport device to a position underneath the transport device.

11. The component placement device as claimed in claim 1, wherein the substrate support is configured to be moved vertically from a position parallel to the transport device to a position underneath the transport device.

12. The component placement device as claimed in claim 1, wherein the at least one substrate support is configured to move the second substrate in a direction perpendicular to the transport direction.

13. A component placement device comprising:
   an elongated transport device that is configured to transport a first substrate in a transport direction parallel to the transport device;
   a component feeder that is located only on one longitudinal side of the transport device;
   at least one component pick-and-place unit that is configured to: (a) pick-up a component from the at least one component feeder; and (b) place the component on the first substrate supported by the elongated transport device; and
   at least one substrate support that is configured to support a second substrate, wherein the at least one substrate support is positioned on only one longitudinal side of the transport device that is opposite from the longitudinal side at which the component feeder is located, and the at least one substrate support has a longitudinal direction that extends perpendicular to the transport device,
   wherein the at least one component pick-and-place unit is configured to: (c) pick-up a component from the at least one component feeder; and (d) move the component over the elongated transport device to place the component on the second substrate supported by the substrate support.

* * * * *